United States Patent

Yamamoto et al.

[11] Patent Number: 6,040,418
[45] Date of Patent: Mar. 21, 2000

[54] FLUORINATED POLYIMIDES, LAMINATED SUBSTRATES AND POLYAMIC ACID SOLUTIONS

[75] Inventors: Tomohiko Yamamoto; Tatsuo Tsumiyama; Kouji Sugimoto, all of Ube, Japan

[73] Assignee: Ube Industries, Ltd., Ube, Japan

[21] Appl. No.: 09/128,665

[22] Filed: Aug. 4, 1998

[30] Foreign Application Priority Data

Aug. 5, 1997 [JP] Japan .................................. 9-210606

[51] Int. Cl.$^7$ .................................................. C08G 73/10
[52] U.S. Cl. .......................... 528/353; 528/125; 528/128; 528/171; 528/172; 528/173; 528/174; 528/179; 528/183; 528/185; 528/220; 528/229; 528/350; 428/411.1; 428/473.5
[58] Field of Search ...................... 528/125, 128, 528/171–174, 179, 183, 185, 220, 229, 350, 353; 428/411.1, 473.5

[56] References Cited

U.S. PATENT DOCUMENTS 5,470,943  11/1995  Sakata et al. ........................... 528/353

FOREIGN PATENT DOCUMENTS

| 0 480 226A2 | 4/1992 | European Pat. Off. . |
|---|---|---|
| 3-101673 | 4/1991 | Japan . |
| 4-047933 | 2/1992 | Japan . |
| 4-077587 | 3/1992 | Japan . |
| 4-235034 | 8/1992 | Japan . |
| 4-239037 | 8/1992 | Japan . |
| 5-1148 | 1/1993 | Japan . |
| 5-178991 | 7/1993 | Japan . |
| 7-292105 | 11/1995 | Japan . |
| 10-001457 | 1/1998 | Japan . |

*Primary Examiner*—P. Hampton-Hightower
*Attorney, Agent, or Firm*—Finnegan, Henderson, Farabow, Garrett & Dunner, L.L.P.

[57] ABSTRACT

Fluorinated polymides comprising units of 2,2',5,5',6,6'-hexafluorobiphenyl-3,3',4,4'-tetracarboxylic dianhydride and aromatic diamines.

11 Claims, No Drawings

FLUORINATED POLYIMIDES, LAMINATED SUBSTRATES AND POLYAMIC ACID SOLUTIONS

BACKGROUND OF THE INVENTION

1. Field of the Invention

The present invention relates to fluorinated polyimides with high heat resistance as well as low dielectric constant, a low thermal expansion coefficient and low birefringence and low water absorption, which can be used for electric and electronic devices, optical materials, machine parts and the like, to laminated substrates employing the fluorinated polyimides, and to polyamic acid solutions comprising polyamic acids, which give fluorinated polyimides, dissolved in organic solvents.

2. Description of the Related Art

Polyimides, which have excellent heat resistance coupled with superior electrical and mechanical properties, have conventionally been applied for a variety of uses as industrial materials, especially in the field of electronic devices.

These commonly used polyimides, however, while having excellent heat resistance, electrical properties and mechanical properties, do not always exhibit satisfactory properties for all uses.

For example, in terms of electrical properties, polyimides used for interlayer insulating films in the field of semiconductors do not sufficiently satisfy demands from the standpoint of their dielectric constant, and, therefore, a further reduction in the dielectric constant of polyimides is desired.

In order to reduce the dielectric constant, in light of this desire, diamines are used which contain fluorine atoms in the molecular backbones of the diamines as structural monomers of the polyimides, or monomers are used which include fluorine-containing groups in the molecular backbones of the tetracarboxylic dianhydrides which are the other structural monomers, to thereby achieve lower dielectric constant in the resulting polyimides. Similar methods are adopted to lower birefringence as well.

For example, in Japanese Unexamined Patent Publications No. 4-47933, No.4-235034, No.4-239037 and elsewhere there is disclosed the use of 2,2'-bis(trifluoromethyl)-4,4'-diaminobiphenyl as the diamine component for polyimides with various aromatic tetracarboxylic anhydrides, which provides an effect of lower dielectric constant. Also, in Japanese Unexamined Patent Publication No. 4-77587 it is disclosed that a lower dielectric constant and a lower thermal expansion coefficient can be achieved with polyimides which are combinations of acid anhydrides that are specifically aromatic tetracarboxylic dianhydrides wherein the aromatic ring is substituted with a fluorine atom-containing organic group, and aromatic diamines wherein the aromatic ring is substituted with a specific organic substituent.

In addition, Japanese Unexamined Patent Publication No. 5-178991 teaches that an effect of lower dielectric constant is achieved for polyimides obtained using 3,3'-diamino-5,5'-bis(trifluoromethyl) diphenyl ether as the aromatic diamine component with various acid anhydrides. Japanese Unexamined Patent Publication No. 7-292105 discloses that polyimides made from 2,6-bis(3-aminophenoxy)-3-trifluoromethylpyridine and various acid anhydrides can provide lower dielectric constant.

Although these disclosed compounds exhibit high performance in terms of individual properties, problems still remain such as an inability to form polyimide films because of insufficient molecular weight of the polyamic acids, or difficulties in the industrial production of the starting monomers.

SUMMARY OF THE INVENTION

It is an object of the invention to provide novel polyimides which have the excellent thermal stability originally associated with polyimides together with the properties of low thermal expansion, low dielectric constant and low water absorption, as well as laminated substrates and polyamic acid solutions employing them.

The present invention provides a fluorinated polyimide comprising repeating units represented by the following general formula (1)

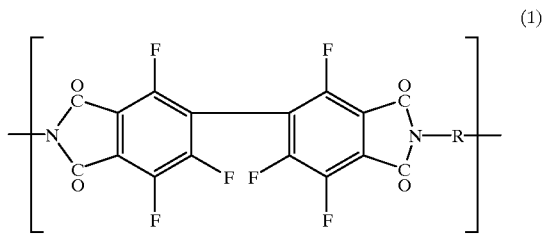

where R represents a divalent organic group.

The invention further provides a laminated substrate prepared by forming a film of the aforementioned fluorinated polyimide onto a base substrate.

The invention still further provides a polyamic acid solution prepared by dissolving, in an organic solvent, a polyamic acid which gives the fluorinated polyimide.

DESCRIPTION OF THE PREFERRED EMBODIMENTS

The polyimide of the invention is a polyimide resulting from polymerization of a diamine with the essential component of 2,2',5,5',6,6'-hexafluorobiphenyl-3,3',4,4'-tetracarboxylic dianhydride or a mixture thereof with its position isomer form 4,2',5,5', 6,6'-hexafluorobiphenyl-2,3,3',4'-tetracarboxylic dianhydride (including half-esters of the acid anhydride and the acid) as the acid anhydride.

The acid anhydride which is the essential component used in the polyimide of the invention may be 2,2',5,5',6,6'-hexafluorobiphenyl-3,3', 4,4'-tetracarboxylic dianhydride or a mixture thereof with its position isomer form 4,2',5,5',6,6'-hexafluorobiphenyl-2,3,3',4'-tetracarboxylic dianhydride. 2,2',5,5',6,6'-hexafluorobiphenyl-3,3',4,4'-tetracarboxylic dianhydride may be obtained according to, for example, the method described in Japanese Unexamined Patent Publication No. 10-1457 or the method described in Japanese Unexamined Patent Publication No. 3-101673, whereby 3,4,5,6-hexafluorophthalonitrile (a publicly known compound) is used as the starting material and dimerized by the Ullmann reaction, after which the resulting 2,2',5,5',6,6'-hexafluorobiphenyl-4,4'-tetracarbonitrile is hydrolyzed in the presence of a sulfuric acid catalyst, and the resulting 2,2',5,5',6,6'-hexafluorobiphenyl-3,3',4,4'-tetracarboxylic acid is subjected to thermal or chemical anhydration.

A portion of the hexafluorobiphenyl-tetracarboxylic dianhydride (preferably no more than 50% by mole, and especially no more than 70% by mole) may also be replaced with another aromatic tetracarboxylic acid dianhydride, such as 3,3',4,4'-benzophenonetetracarboxylic dianhydride, 3,3',4,4'-biphenyltetracarboxylic dianhydride, 2,3,3',4'- biphenyltetracarboxylic dianhydride, 3,3',4,4'-diphenylether tetracarboxylic dianhydride, bis(3,4-dicarboxyphenyl) methane, 2,2-bis(3,4-dicarboxyphenyl)propane or pyromellitic dianhydride (including the acids and their half-esters).

As the diamine which is the other component to be used according to the invention there may be mentioned m-phenylenediamine, o-phenylenediamine, p-phenylenediamine, benzidine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenylsulfide, 3,3'-diaminodiphenyl sulfone, 3,4'-diaminodiphenyl sulfone, 4,4'-diaminodiphenyl sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, 2,2-bis(4-aminophenyl) propane, 2,2-bis(3-aminophenyl)propane, 2-(3-aminophenyl)-2-(4-aminophenyl)propane, 2,2-bis(4-aminophenyl)-1,1,1,3,3,3-hexafluoropropane, 2,2-bis(3-aminophenyl)-1,1,1,3,3,3-hexafluoropropane, 2-(3-aminophenyl)-2-(4-aminophenyl)-1,1,1,3,3,3-hexafluoropropane, 1,3-bis(3-aminophenoxy)benzene, 1,3-bis(4-aminophenoxy)benzene, 1,4-bis(3-aminophenoxy) benzene, 1,4-bis(4-aminophenoxy)benzene, 1,3-bis(3-aminobenzoyl)benzene, 1,4-bis(3-aminobenzoyl)benzene, 1,3-bis(4-aminobenzoyl)benzene, 1,4-bis(4-aminobenzoyl) benzene, 3,3'-diamino-4-phenoxybenzophenone, 4,4'-diamino-5-phenoxybenzophenone, 3,4'-diamino-4-phenoxybenzophenone, 3,4'-diamino-5-phenoxybenzophenone, 4,4'-bis(4-aminophenoxy)biphenyl, 3,3'-bis(4-aminophenoxy)biphenyl, 3,4'-bis(3-aminophenoxy)biphenyl, bis[4-(4-aminophenoxy)phenyl] ketone, bis[4-(3-aminophenoxy)phenyl] ketone, bis[3-(4-aminophenoxy)phenyl] ketone, bis[3-(3-aminophenoxy) phenyl] ketone, 3,3'-diamino-4,4'-diphenoxydibenzophenone, 4,4'-diamino-5,5'-diphenoxybenzophenone, 3,4'-diamino-4,5'-diphenoxybenzophenone, bis[4-(4-aminophenoxy)phenyl] sulfide, bis[3-(4-aminophenoxy)phenyl] sulfide, bis[4-(3-aminophenoxy) phenyl] sulfide, bis[3-(4-aminophenoxy) phenyl] sulfide, bis[3-(3-aminophenoxy)phenyl] sulfide, bis [3-(4-aminophenoxy)phenyl] sulfone, bis[4-(4-aminophenyl)] sulfone, bis[3-(3-aminophenoxy)phenyl] sulfone, bis[4-(3-aminophenyl)] sulfone, bis[4-(3-aminophenoxy)phenyl] ether, bis[4-(4-aminophenoxy) phenyl] ether, bis[3-(3-aminophenoxy)phenyl] ether, bis[4-(3-aminophenoxy)phenyl] methane, bis[4-(4-aminophenoxy)phenyl] methane, bis[3-(3-aminophenoxy) phenyl] methane, bis[3-(4-aminophenoxy)phenyl] methane, 2,2-bis[4-(3-aminophenoxy)phenyl] propane, 2,2-bis[4-(4-aminophenoxy)phenyl] propane, 2,2-bis[3-(3-aminophenoxy)phenyl] propane, 2,2-bis[4-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-bis[3-(3-aminophenoxy)phenyl]-1,1,1,3,3,3-hexafluoropropane, 2,2-bis[3-(4-aminophenoxy)phenyl]-1,1,1,3,3,3-hexafluoropropane, 1,4-bis[4-(3-aminophenoxy)benzoyl] benzene, 1,3-bis[4-(3-aminophenoxy)benzoyl] benzene, 1,3-bis(3-amino-4-phenoxybenzoyl) benzene, 1,4-bis(3-amino-4-phenoxybenzoyl) benzene, 1,3-bis(4-amino-5-phenoxybenzoyl) benzene, 1,3-bis(4-amino-5-biphenoxybenzoyl) benzene, 1,4-bis(4-amino-5-biphenoxybenzoyl) benzene, 1,3-bis(3-amino-4-biphenoxybenzoyl) benzene, 1,4-bis(3-amino-4-biphenoxybenzoyl) benzene, 1,4-bis[4-(4-aminophenoxy)-α,α-dimethylbenzyl] benzene, 1,3-bis[4-(4-aminophenoxy)-α,α-dimethylbenzyl] benzene, 1,3-bis[4-(4-amino-6-trifluoromethylphenoxy)-α,α-dimethylbenzyl] benzene, 1,3-bis[4-(4-amino-6-fluoromethylphenoxy)-α,α-dimethylbenzyl] benzene, 1,3-bis[4-(4-amino-6-methylphenoxy)-α,α-dimethylbenzyl] benzene, 1,3-bis[4-(4-amino-6-cyanophenoxy)-α,α-dimethylbenzyl] benzene and diaminopolysiloxane. These may be used alone or in combinations of 2 or more.

The polyimide of the invention is obtained by polymerization with the aromatic tetracarboxylic dianhydride and the diamine component in a molar ratio of 1.00:1.00 and followed by imidation. The polymerization may be carried out with one of these starting materials in a molar excess for adjustment of the molecular weight.

The process for producing a polyimide of the invention may be any process including one of those which are known, but a preferred process is one in which both components are reacted in an organic solvent to form the polyamic acid, after which heating and/or chemical imidation gives the polyimide resin.

As examples of organic solvents used in such processes there may be mentioned N,N-dimethylacetamide, N-methyl-2-pyrrolidone, N,N-dimethylformamide, N,N-diethylacetamide, N,N-dimethoxyacetamide, 1,3-dimethyl-2-imidazolidinone, N-methylcaprolactam, 1,2-dimethoxyethane, bis-(2-methoxyethyl) ether, 1,2-bis(2-methoxyethoxy) ethyl ether, tetrahydrofuran, 1,3-dioxane, 1,4-dioxane, pyridine, dimethylsulfoxide, dimethylsulfone, tetramethylurea, hexamethylphosphoramide, phenol, anisole, etc. Particularly preferred for use among these are N,N-dimethylacetamide, N-methyl-2-pyrrolidone and N,N-dimethylformamide.

These organic solvents may be used alone or in mixtures of 2 or more.

The polyamic acid solution according to the invention is obtained by adding the diamine component and acid dianhydride component to an organic solvent and performing polymerization. The method for adding the diamine component and the acid dianhydride to the organic solvent is not particularly limited, but given the solubility of acid dianhydrides, a preferred method is to add the acid dianhydride after first dissolving the diamine in the organic solvent.

Also, since cleavage and recrystallization of the polymer chain occurs during the polymerization and imidation process when 3 or more different acid anhydrides and diamines are used as the monomer components, the form of polymerization may be random, block or sequential polymerization and polyamic acid solutions with different compositions may be combined, so long as the final resulting proportions of the components are in the ranges specified above.

The polymerization temperature is normally 250° C. or lower, and preferably 60° C. or lower. The polymerization pressure is not particularly limited, but it is usually normal pressure.

The polyamic acid solution according to the invention preferably has a polymer component concentration of 3–50 wt % in the solution, and an inherent viscosity of the polyamic acid (30° C., 0.5 g/100 ml of N,N-dimethylacetamide) of at least 0.2, especially 0.2–2.0. Fluorinated polyimides obtained from such polyamic acids are preferred for achieving the object of the invention.

The organic solvent for the polyamic acid solution of the invention may be exactly as used for the polymerization, or another organic solvent may be added after polymerization.

The fluorinated polyimide according to the invention can be obtained as a polyimide resin from imidation of the polyamic acid, by thermal dehydration of the polyamic acid solution after application onto a substrate or in the reactor at a temperature of 200° C. or higher, preferably a temperature of 200–450° C. (maximum heating temperature) for anhydration, or by chemical imidation using a tertiary amine catalyst and an anhydride of a dehydrating agent as imidating agents, for example, a tertiary amine such as triethylamine, pyridine, β-picoline, 3,4-lutidine, 3,5-lutidine, 4-methylpyridine, 4-isopropylpyridine, N,N-dimethylbenzylamine, etc. and an anhydride of a dehydrating agent such as acetic anhydride or propionic anhydride. The tertiary amine is used at zero to a few molar equivalents of the dehydrating anhydride.

For example, a fluorinated polyimide film can be obtained by a polyimide film-forming method whereby a varnish of a polyamic acid solution is coated onto a base material such as a glass plate or metal belt and then thermally or chemically imidated, or by coating a polyamic acid varnish onto a base material, heating to the above-mentioned temperature for imidation and then drying.

Alternatively, the polyamic acid may be imidated from the polyamic acid solution to obtain a polyimide powder, and then after coating a base with a solution of the polyimide, and then drying it under heat to obtain a fluorinated polyimide film.

Preferably, the fluorinated polyimide thus obtained has a thermal expansion coefficient of not more than 90% of that of a corresponding polyimide having repeating units of the general formula (1) in which all of the fluorine atoms were replaced by hydrogen atoms. It is also preferable that the fluorinated polyimide has a water absorption of not more than 1.5%.

The polyimide resin of the invention may be used alone or with addition of carbon fibers, glass fibers, aramid fibers, potassium titanate fibers, silica-based inorganic fillers, aluminum-based inorganic fillers, magnesium-based inorganic fillers, titanium-based inorganic fillers, carbon-based inorganic fillers and the like.

Other various additives may also be used.

A laminated substrate of the invention may be obtained with a fluorinated polyimide film formed on a base substrate, by coating the above-mentioned polyamic acid solution varnish to a dry thickness of 0.5–100 μm on a base substrate such as a silicon wafer or a 0.005–10 mm thick metal (copper, gold, silver, copper alloy, stainless metal, aluminum, etc.) substrate, and then heating to the temperature mentioned above for imidation and then drying to make a fluorinated polyimide film. Thus, a semiconductor element comprising a silicon wafer tip having an insulating film consisting of the fluorinated polyimide formed thereon can be obtained, in which the fluorinated polyimide film is firmly adhered to the silicon wafer tip.

When producing a laminated substrate according to the invention, the polyamic acid varnish may be directly applied to the substrate, or an aminosilane-based heat resistant surface treatment agent or titanate-based heat resistant surface treatment agent may be applied to the substrate surface and dried before applying the polyamic acid varnish.

According to the invention it is possible to obtain, from industrially producible aromatic tetracarboxylic dianhydrides and aromatic diamines, fluorinated polyimides of high molecular weight and satisfactory transparency, having glass transition temperatures of 250° C. and greater, especially 290° C. and greater, and with the excellent high heat resistance originally associated with polyimides together with the properties of a low thermal expansion coefficient, low dielectric constant, low birefringence and low water absorption.

The present invention will now be further explained by way of examples.

The properties of the polyimides and polyamic acids in the following examples were measured by the following methods.

Inherent viscosity of polyamic acid

Measured at 30° C. with 0.5 g of polyamic acid dissolved in 100 ml of N,N-dimethylacetamide.

Glass transition temperature (Tg)

Measured at a temperature elevating rate of 10° C./min using a DSC (DSC-210, product of Seiko Electronics Co.)

Relative dielectric constant ($\epsilon$)

Measured according to ASTM D-156-87 using a 4194A Impedance Analyzer, product of Hewlett-Packard Co.

Thermal expansion coefficient

Measured according to ASTM D696-79 at a temperature elevating rate of 10° C./min, without stress relaxation.

Birefringence

An automatic birefringence meter (KOBRA-21DH) manufactured by Shin Oji Paper Co. was used to determine ΔNxy at a wavelength of 590 nm.

Water absorption

Measured according to ASTM D570-63.

Reference Example 1

Synthesis of 2,2',5,5',6,6'-hexafluorobiphenyl-3,3',4,4'-tetracarboxylic dianhydride (1) Synthesis of 2,2',5,5',6,6'-hexafluorobiphenyl-4,4'-tetracarbonitrile After charging 5.0 g (25 millimoles) of 3,4,5,6-hexafluorophthalonitrile (melting point: 86° C., product of Fluorochem Co.) and 4.15 g (25 millimoles) of potassium iodide into a 100 ml three-neck flask equipped with a reflux cooling tube, the interior of the flask was purged with nitrogen. Upon addition of 35 ml of dimethylformamide thereto the mixture was reacted at 140° C. for 3 hours. After the reaction, the reaction solution was cooled to room temperature and 150 ml of ethyl acetate was added. A 3% aqueous hydrochloric acid solution and then a 10% aqueous sodium thiosulfate solution were added to the reaction solution which was subsequently washed. After next distilling off the ethyl acetate, the residue was purified by column chromatography to obtain 2,2',5,5',6,6'-hexafluorobiphenyl-4,4'-tetracarbonitrile at a 46% yield.

(2) Synthesis of 2,2',5,5',6,6'-hexafluorobiphenyl-3,3',4,4'-tetracarboxylic dianhydride A 10.2 g portion of the 2,2',5,5',6,6'-hexafluorobiphenyl-4,4'-tetracarbonitrile obtained by the method of (1) above was loaded into a 100 ml round-bottomed flask equipped with a cooling tube, and then 250 ml of 70% sulfuric acid was loaded prior to heating at 130° C. for 4 hours of reaction. After the reaction, the reaction solution was cooled to room temperature and 60 ml of water was added. The solution was then extracted with isopropyl ether using a separatory funnel, and after washing the extract with water, the solvent was distilled off to obtain purified 2,2',5,5',6,6'-hexafluorobiphenyl-3,3',4,4'-tetracarboxylic acid with a melting point of 185° C. The 2,2',5,5',6,6'-hexafluorobiphenyl-3,3',4,4'-tetracarboxylic acid was heated at 180° C. in a vacuum for 5 hours and then dewatered to obtain 9.2 g of 2,2',5,5',6,6'-hexafluorobiphenyl-3,3',4,4'-tetracarboxylic dianhydride with a melting point of 223° C.

EXAMPLE 1

A stirrer was placed in a 100 ml three-neck flask and 20 ml of N-methyl-2-pyrrolidone (hereunder abbreviated as NMP) was loaded as the polymerization solvent, after which 1.076 g (9.946 millimoles) of p-phenylenediamine was loaded, the mixture was stirred with a magnet stirrer while loading 4.000 g (9.946 millimoles) of the 2,2',5,5',6,6'-hexafluorobiphenyl-3,3',4,4'-tetracarboxylic dianhydride (hereunder abbreviated as 6F-BPDA) synthesized in the Reference Example, and the reaction was conducted at normal temperature for 8 hours. The viscosity of the polyamic acid polymerization solution increased as the reaction time progressed, and upon completion of the reaction the inherent viscosity of the polymerization solution was 0.40.

The polyamic acid solution was coated onto a glass plate, and heating in an oven at 100° C. for 10 minutes, 130° C. for 5 minutes, 200° C. for 10 minutes and 250° C. for 30 minutes gave a transparent polyimide film. The properties of the polyimide film were measured by the evaluation methods described above. The results are summarized in Table 1.

The polyamic acid solution was also coated onto a silicon wafer using a spin coater and then dried at 130° C. for 5 minutes, 200° C. for 10 minutes and 250° C. for 30 minutes to obtain a laminated substrate with a transparent fluorinated polyimide film formed to a thickness of 5 μm.

Measurement of the adhesive strength between the film and the base by a cross-cut adhesion test revealed strong adhesion with absolutely no peeled sections.

EXAMPLE 2

The same procedure was carried out as in Example 1, except that 1.990 g (9.946 millimoles) of 4,4'-diaminodiphenyl ether was used as the diamine and 4.000 g (9.946 millimoles) of 6F-BPDA was used as the acid anhydride. The inherent viscosity of the polyamic acid was 0.52.

The transparent polyimide film was also evaluated in the same manner. The results are summarized in Table 1.

The polyamic acid solution was coated onto a silicon wafer using a spin coater and dried under the same conditions as Example 1, to obtain a laminated substrate with a transparent fluorinated polyimide film formed to a thickness of 4 μm.

Measurement of the adhesive strength between the film and the base by a cross-cut adhesion test revealed strong adhesion with absolutely no peeled sections.

EXAMPLE 3

The same procedure was carried out as in Example 1 with the same number of moles loaded and polymerization conditions, etc., except that 2,2-bis[3-(4-aminophenoxy)phenyl]-1,1,1,3,3,3-hexafluoropropane was used as the diamine. The inherent viscosity of the polyamic acid was 0.54.

The transparent polyimide film was also evaluated in the same manner. The results are summarized in Table 1.

The polyamic acid solution was coated onto a silicon wafer using a spin coater and dried under the same conditions as Example 1, to obtain a laminated substrate with a transparent fluorinated polyimide film formed to a thickness of 5 μm.

Measurement of the adhesive strength between the film and the base by a cross-cut adhesion test revealed strong adhesion with absolutely no peeled sections.

EXAMPLE 4

The same procedure was carried out as in Example 1 with the same number of moles loaded and polymerization conditions, etc., except that 2,2-bis(4-aminophenyl)-1,1,1,3,3,3-hexafluoropropane was used as the diamine. The inherent viscosity of the polyamic acid was 0.27.

The transparent polyimide film was also evaluated in the same manner. The results are summarized in Table 1.

The polyamic acid solution was coated onto a silicon wafer using a spin coater and dried under the same conditions as Example 1, to obtain a laminated substrate with a transparent fluorinated polyimide film formed to a thickness of 3 μm.

Measurement of the adhesive strength between the film and the base by a cross-cut adhesion test revealed strong adhesion with absolutely no peeled sections.

EXAMPLE 5

The same procedure was carried out as in Example 1 with the same number of moles loaded and polymerization conditions, etc., except that 2,2-bis(3-aminophenyl)-1,1,1,3,3,3-hexafluoropropane was used as the diamine. The inherent viscosity of the polyamic acid was 0.28.

The transparent polyimide film was also evaluated in the same manner. The results are summarized in Table 1.

The polyamic acid solution was coated onto a silicon wafer using a spin coater and dried under the same conditions as Example 1, to obtain a laminated substrate with a transparent fluorinated polyimide film formed to a thickness of 3 μm.

Measurement of the adhesive strength between the film and the base by a cross-cut adhesion test revealed strong adhesion with absolutely no peeled sections.

Comparative Example 1

A stirrer was placed in a 100 ml three-neck flask and 20 ml of N,N-dimethylacetamide (hereunder abbreviated as DMAC) was loaded as the polymerization solvent, after which 1.076 g (9.946 millimoles) of p-phenylenediamine was loaded, the mixture was stirred with a magnet stirrer while loading 2.9263 g (9.946 millimoles) of 3,3',4,4'-biphenyltetracarboxylic dianhydride (hereunder abbreviated as s-BPDA) and reaction was conducted at normal temperature for 8 hours. The viscosity of the polyamic acid polymerization solution increased as the reaction time progressed, and upon completion of the reaction the inherent viscosity of the polymerization solution was 1.40.

The polyamic acid solution was coated onto a glass plate, and heating in an oven at 100° C. for 10 minutes, 130° C. for 5 minutes, 200° C. for 10 minutes and 250° C. for 30 minutes gave a reddish brown polyimide film. The properties of the polyimide film were measured by the evaluation methods described above. The results are summarized in Table 1.

Comparative Example 2

After loading 20 ml of NMP as the polymerization solvent, 1.990 g (9.946 millimoles) of 4,4'-diaminodiphenyl ether was loaded, the mixture was stirred with a magnet stirrer while loading 2.9263 g (9.946 millimoles) of s-BPDA, and reaction was conducted at normal temperature for 8 hours. The viscosity of the polyamic acid polymerization solution increased as the reaction time progressed, and upon completion of the reaction the inherent viscosity of the polymerization solution was 1.28.

The polyamic acid solution was coated onto a glass plate, and heating in an oven at 100° C. for 10 minutes, 130° C. for 5 minutes, 200° C. for 10 minutes and 250° C. for 30 minutes gave a reddish brown polyimide film. The properties of the polyimide film were measured by the evaluation methods described above. The results are summarized in Table 1.

Comparative Example 3

The same procedure was carried out as in Comparative Example 1 with the same number of moles loaded and polymerization conditions, etc., except that 2,2-bis[3-(4-aminophenoxy)phenyl]-1,1,1,3,3,3-hexafluoropropane was used as the diamine. The inherent viscosity of the polyamic acid was 0.82.

The transparent polyimide film was also evaluated in the same manner. The results are summarized in Table 1.

4,4-HFBAPP: 2,2-bis[4-(4-aminophenoxy)phenyl]-1,1,1,3,3,3-hexafluoropropane
3,3-HFBAPP: 2,2-bis[3-(3-aminophenoxy)phenyl]-1,1,1,3,3,3-hexafluoropropane
3,4-HFBAPP: 2,2-bis[3-(4-aminophenoxy)phenyl]-1,1,1,3,3,3-hexafluoropropane
4-HFBAPhP: 2,2-bis(4-aminophenyl)-1,1,1,3,3,3-hexafluoropropane
3-HFBAPhP: 2,2-bis(3-aminophenyl)-1,1,1,3,3,3-hexafluoropropane

TABLE 1

| | Polyimide (components) | | Polyamic | | Polyimide film properties | | | |
|---|---|---|---|---|---|---|---|---|
| | Acid component | Diamine component | acid ηinh | Tg (° C.) | Relative dielectric constant (ε) | Thermal expansion coefficient (ppm) | Birefringence ΔNxy | Water absorption (%) |
| Example 1 | 6F-BPDA | PPD | 0.40 | 450< | 3.1 | 1.0 | 0.00003 | 1.24 |
| Comp. Ex. 1 | BPDA | PPD | 1.40 | 450< | 3.4 | 2.0 | 0.051 | 1.8 |
| Example 2 | 6F-BPDA | 4-DADE | 0.52 | 380 | 3.09 | 3.0 | 0.00003 | 0.5 |
| Comp. Ex. 2 | BPDA | 4-DADE | 1.28 | 380 | 3.4 | 3.57 | 0.00009 | 1.7 |
| Example 3 | 6F-BPDA | 3,4-HFBAPP | 0.54 | 291 | 2.87 | 4.67 | 0.00002 | 0.1 |
| Comp. Ex. 3 | BPDA | 3,4-HFBAPP | 0.82 | 300 | 2.95 | 5.37 | 0.00003 | 0.55 |
| Example 4 | 6F-BPDA | 4-HFBAPhP | 0.27 | 320 | 3.1 | 2.67 | 0.00003 | 1.32 |
| Example 5 | 6F-BPDA | 3-HFBAPhP | 0.28 | 305 | 2.89 | 5.17 | 0.00003 | 1.32 |

EXAMPLE 6

Fluorinated polyimides are obtained in the same manner as Example 1 except for using the monomers listed in Table 2.

The components of the resulting fluorinated polyimides are listed in Table 2.

The component abbreviations represent the following compounds.

Aromatic tetracarboxylic dianhydrides

6F-BPDA: 2,2',5,5',6,6'-hexafluorobiphenyl-3,3',4,4'-tetracarboxylic dianhydride s-BPDA: 3,3',4,4'-biphenyltetracarboxylic dianhydride PMDA: pyromellitic dianhydride BTDA: 3,3',4,4'-benzophenonetetracarboxylic dianhydride ODPA: 3,3',4,4'-diphenylether tetracarboxylic dianhydride Aromatic diamines PPD: p-phenylenediamine 3-DADE: 3,3'-diaminodiphenyl ether 4-DADE: 4,4'-diaminodiphenyl ether 3-DADM: 3,3'-diaminodiphenylmethane 4-DADM: 4,4'-diaminodiphenylmethane 4-APP: 2,2-bis(4-aminophenyl)propane 3-APP: 2,2-bis(3-aminophenyl)propane 1,3-3APB: 1,3-bis(3-aminophenoxy)benzene 1,3-4APB: 1,3-bis(4-aminophenoxy)benzene 1,4-3APB: 1,4-bis(3-aminophenoxy)benzene DAPB: 3,3'-diamino-4-phenoxybenzophenone 4,4-BAPE: bis[4-(4-aminophenoxy)phenyl] ether 3,3-BAPE: bis[3-(3-aminophenoxy)phenyl] ether 4,4-BAPP: 2,2-bis[4-(4-aminophenoxy)phenyl]propane 4,3-HFBAPP: 2,2-bis[4-(3-aminophenoxy)phenyl]-1,1,1,3,3,3-hexafluoropropane

TABLE 2

| Fluorinated polyimides | | | |
|---|---|---|---|
| Acid components | | Diamine components | |
| First component | Second component | First component | Second component |
| (molar ratio) | | (molar ratio) | |
| 6F-BPDA | — | 3-DADE | — |
| 6F-BPDA | — | 4-DADM | — |
| 6F-BPDA | — | 3-DADM | — |
| 6F-BPDA | — | 4-APP | — |
| 6F-BPDA | — | 3-APP | — |
| 6F-BPDA | — | 1,3-3APB | — |
| 6F-BPDA | — | 1,3-4APB | — |
| 6F-BPDA | — | 1,4-3APB | — |
| 6F-BPDA | — | DAPB | — |
| 6F-BPDA | — | 4,4-BAPE | — |
| 6F-BPDA | — | 3,3-BAPE | — |
| 6F-BPDA | — | 4,4-BAPP | — |
| 6F-BPDA | — | 4,3-HFBAPP | — |
| 6F-BPDA | — | 4,4-HFBAPP | — |
| 6F-BPDA | — | 3,3-HFBAPP | — |
| 6F-BPDA(80) | ODPA(20) | PPD | — |
| 6F-BPDA(80) | ODPA(20) | 4-DADE(DADE) | — |
| 6F-BPDA(80) | PMDA(20) | DADE | — |
| 6F-BPDA(80) | BTDA(20) | DADE | — |
| 6F-BPDA | — | 4,3-HFBAPP(50) | PPD(50) |
| 6F-BPDA | — | 4,4-HFBAPP(50) | DADE(50) |
| 6F-BPDA(80) | ODPA(20) | 3,3-HFBAPP(50) | DADE(50) |

According to the present invention, the following effects are exhibited.

The fluorinated polyimides of the invention have high molecular weight and satisfactory transparency, and have the excellent high heat resistance originally associated with polyimides together with the properties of a low thermal expansion coefficient, low dielectric constant, low birefringence and low water absorption.

Laminated substrates according to the invention have fluorinated polyimide films with high molecular weight, whose polyimides have high heat resistance as well as a low thermal expansion coefficient, low dielectric constant, low birefringence and low water absorption.

Polyamic acid solutions according to the invention can give fluorinated polyimides which are polymers of high molecular weight, with high heat resistance as well as a low thermal expansion coefficient, low dielectric constant, low birefringence and low water absorption.

We claim:

1. A fluorinated polyimide consisting essentially of one or more aromatic tetracarboxylic acid components and one or more aromatic diamine components, said aromatic tetracarboxylic acid components being derived from more than 50% by mole of 2,2',5,5',6,6'-hexafluorobiphenyl-3,3',4,4'-tetracarboxylic dianhydride or a mixture of 2,2',5,5',6,6'-hexafluorobiphenyl-3,3',4,4'-tetracarboxylic dianhydride and 4,2',5,5',6,6'-hexafluorobiphenyl-2,3,3',4'-tetracarboxylic dianhydride and not more than 50% by mole of at least one member selected from the group consisting of 3,3',4,4'-benzophenonetetracarboxylic, dianhydride, 3,3',4,4'-biphenyltetracarboxylic dianhydride, 2,3,3',4'-biphenyltetracarboxylic dianhydride, 3,3',4,4'-diphenylether tetracarboxylic dianhydride, bis(3,4-dicarboxyphenyl) methane, 2,2-bis(3,4-dicarboxyphenyl)propane and pyromellitic dianhydride, and said aromatic diamine components being derived from at least one member selected from the group consisting of m-phenylenediamine, o-phenylenediamine, p-phenylenediamine, benzidine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, 2,2-bis(4-aminophenyl)propane, 2,2-bis(3-aminophenyl)propane, 2-(3-aminophenyl)-2-(4-aminophenyl)propane, 2,2-bis(4-aminophenyl)-1,1,1,3,3,3-hexafluoropropane, 2,2-bis(3-aminophenyl)-1,1,1,3,3,3-hexafluoropropane, 2-(3-aminophenyl)-2-(4-aminophenyl)-1,1,1,3,3,3-hexafluoropropane, 1,3-bis(3-aminophenxoy)benzene, 1,3-bis(4-aminophenxoy)benzene, 1,4-bis(3-aminophenoxy)benzene, 1,4-bis(4-aminophenoxy)benzene, 1,3-bis(3-aminobenzoyl)benzene, 1,4-bis(3-aminobenzoyl)benzene, 1,3-bis(4-aminobenzoyl)benzene, 1,4-bis(4-aminobenzoyl)benzene, 3,3'-diamino-4-phenoxybenezophenone, 4,4'-diamino-5-phenoxybenzophenone, 3,4'-diamino-4-phenoxybenzophenone, 3,4'-diamino-5-phenoxybenzophenone, 4,4'-bis(4-aminophenoxy)biphenyl, 3,3'-bis(4-aminophenoxy)biphenyl, 3,4'-bis(3-aminophenoxy)biphenyl, bis[4-(4-aminophenoxy)phenyl] ketone, bis[4-(3-aminophenoxy)phenyl]ketone, bis[3-(4-aminophenoxy)phenyl]ketone, bis[3-(3-aminophenoxy) phenyl]ketone, 3,3'-diamino-4,4'-diphenxoydibenzophenene, 4,4'-diamino-5,5'-diphenoxybenzophenone, 3,4'-diaamino-4,5'-diphenoxybenzophene, bis(4-(4-aminophenoxy)phenyl] sulfide, bis[3-(4-aminophenoxy)phenyl] sulfide, bis[4-(3-aminophenoxy)phenyl] sulfide, bis[3-(3-aminophenoxyl) phenyl] sulfide, bis[3-(4-aminophenoxyl) phenyl] sulfone, bis[4-(4-aminophenoxy)phenyl] sulfone, bis[3-(3-aminophenoxy)phenyl] sulfone, bis[4-(3-aminophenoxy) phenyl] sulfone, bis[4-(3-aminophenoxyl)phenyl] ether, bis [4-(4-aminophenoxy)phenyl] ether, bis[3-(3-aminophenoxy)phenyl] ether, bis[4-(3-aminophenoxy) phenyl]methane, bis[4-4-aminophenoxy)phenyl]methane, bis[3-(3-aminophenxoy)phenyl]methane, bis[3-(4-aminophenoxy)phenyl]methane, 2,2-bis[4-(3-aminophenoxy)phenyl]propane, 2,2-bis[4-(4-aminophenoxy)phenyl]propane, 2,2-bis[3-(3-aminophenoxy)phenyl]propane, 2,2-bis[4-(3-aminophenoxy)phenyl]-1,1,1,3,3,3-hexafluoropropane, 2,2-bis[4-4-aminophenoxy)phenyl]-1,1,1,3,3,3-hexafluoropropane, 2,2-bis[3-(3-aminophenoxy)phenyl]-1,1,1,3,3,3-hexafluoropropane, 2,2-bis[3-(4-aminophenoxy) phenyl]-1,1,1,3,3,3-hexafluoropropane, 1,4-bis[4-(3-aminophenoxy)benzoyl]benzene, 1,3-bis[4-(3-aminophenoxy)benzoyl]benzene, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,3-bis(4-amino-5-biphenoxybenzoyl)benzene, 1,4-bis(4-amino-5-biphenoxybenzoyl)benzene, 1,3-bis(3-amino-4-biphenoxylbenzoyl)benzene, 1,4-bis(3-amino-4-biphenoxybenzoyl)benzene, 1,4-bis[4-(4-aminophenoxy)-α,α-dimethylbenzyl]benzene, 1,3-bis[4-(4-aminophenoxy)-α,α-dimethylbenzyl]benzene, 1,3-bis[4-(4-amino-6-trifluoromethylphenoxy)-α,α-dimethylbenzyl]benzene, 1,3-bis[4-(4-amino-6-fluoromethylphenoxy)-α,α-dimethylbenzyl]benzene, 1,3-bis[4-(4-amino-6-methylphenoxy)-α,α-dimethylbenzyl]benzene and 1,3-bis [4-(4-amino-6-cyanophenoxy)-α,α-dimethylbenzyl] benzene.

2. A fluorinated polyimide according to claim 1, wherein said aromatic diamine components are derived from at least one member selected from the group consisting of p-phenylenediamine, 3,3'-diaminodiphenyl ether, 4,4'-diaminodiphenyl ether, 3,3'-diaminodiphenylmethane, 4,4'-diaminodiphenylmethane, 2,2-bis(4-aminophenyl)propane, 2,2-bis(3-aminophenyl)propane, 2,2-bis(4-aminophenyl)-1,1,1,3,3,3-hexafluoropropane, 2,2-bis(3-aminophenyl)-1,1,1,3,3,3-hexafluoropropane, 1,3-bis(3-aminophenoxy)benzene, 1,3-bis(4-aminophenoxy)benzene, 1,4-bis(3-aminophenoxy)benzene, 3,3'-diamino-4-phenoxybenzophenone, bis[4-(4-aminophenoxy)phenyl] ether, bis[3-(3-aminophenoxy)phenyl] ether, 2,2-bis[4-(4-aminophenoxy)phenyl]propane, 2,2-bis[4-(3-aminophenoxyl)phenyl]-1,1,1,3,3,3-hexafluoropropane, 2,2-bis[4-(4-aminophenoxy)phenyl]-1,1,1,3,3,3-hexafluoropropane, 2,2-bis[3-(3-aminophenoxy)phenyl]-1,1,1,3,3,3-hexafluoropropane and 2,2-bis[3-(4-aminophenoxy)phenyl]-1,1,1,3,3,3-hexafluoropropane.

3. A fluorinated polyimide according to claim 2, wherein said aromatic diamine components are derived from at least one member selected from the group consisting of p-phenylenediamine, 4,4'-diaminodiphenyl ether, 2,2-bis(4-aminophenyl)-1,1,1,3,3,3-hexafluoropropane, 2,2-bis(3-aminophenyl)-1,1,1,3,3,3-hexafluoropropane and 2,2-bis[3-(4-aminophenoxy)phenyl]-1,,1 ,3,3,3-hexafluoropropane.

4. A fluorinated polyimide according to claim 1, which has a thermal expansion coefficient of not more than 90% of that of a polyimide according to claim 1 in which all of the fluorine atoms were replaced by hydrogen atoms.

5. A fluorinated polyimide according to claim 1, which has a water absorption of not more than 1.5%.

6. A fluorinated polyimide according to claim 1, wherein a polyamic acid as a precursor of the polyimide has an inherent viscosity of 0.2 to 2.0 as measured at 30° C. for a solution of 0.5 g/100 ml of N,N-dimethylacetamide.

7. A laminated substrate prepared by forming a film of a fluorinated polyimide according to claim 1 onto a base substrate.

8. A semiconductor element comprising a silicon wafer tip having an insulating film of a fluorinated polyimide according to claim 1 formed thereon.

9. A laminated structure comprising a silicon wafer tip having a film of a fluorinated polyimide according to claim 1 firmly adhered thereto.

10. A polyamic acid solution prepared by dissolving in an organic solvent a polyamic acid which gives a fluorinated polyimide according to claim 1.

11. A polyamic acid solution according to claim 10, having a polymer component concentration of 3 to 50 wt %.

* * * * *

UNITED STATES PATENT AND TRADEMARK OFFICE
CERTIFICATE OF CORRECTION

PATENT NO. : 6,040,418  
DATED : March 21, 2000  
INVENTOR(S) : Tomohiko Yamamoto et al.

Page 1 of 1

It is certified that error appears in the above-identified patent and that said Letters Patent is hereby corrected as shown below:

<u>Claim 3, Column 12,</u>
Line 51, "1,,1" should read -- 1,1,1 --.

Signed and Sealed this

Twenty-eighth Day of August, 2001

Attest:

NICHOLAS P. GODICI  
Attesting Officer  
Acting Director of the United States Patent and Trademark Office